United States Patent
Okita et al.

(10) Patent No.: US 9,412,858 B2
(45) Date of Patent: Aug. 9, 2016

(54) GROUP III NITRIDE SEMICONDUCTOR DEVICE WHICH CAN BE USED AS A POWER TRANSISTOR

(71) Applicant: Panasonic Intellectual Property Management Co., Ltd., Osaka (JP)

(72) Inventors: Hideyuki Okita, Toyama (JP); Masahiro Hikita, Toyama (JP); Yasuhiro Uemoto, Toyama (JP)

(73) Assignee: PANASONIC INTELLECTUAL PEOPERTY MANAGEEMENT CO., LTD., Osaka (JP)

( * ) Notice: Subject to any disclaimer, the term of this patent is extended or adjusted under 35 U.S.C. 154(b) by 0 days.

(21) Appl. No.: 14/983,602

(22) Filed: Dec. 30, 2015

(65) Prior Publication Data

US 2016/0118491 A1 Apr. 28, 2016

Related U.S. Application Data

(63) Continuation of application No. PCT/JP2014/003233, filed on Jun. 17, 2014.

(30) Foreign Application Priority Data

Jul. 12, 2013 (JP) ................................. 2013-146125

(51) Int. Cl.
*H01L 29/66* (2006.01)
*H01L 29/778* (2006.01)
(Continued)

(52) U.S. Cl.
CPC ........ *H01L 29/7789* (2013.01); *H01L 29/2003* (2013.01); *H01L 29/205* (2013.01); *H01L 29/7787* (2013.01); *H01L 29/7788* (2013.01)

(58) Field of Classification Search
CPC ..................... H01L 29/2003; H01L 29/66462; H01L 29/778; H01L 29/66431; H01L 21/0254
See application file for complete search history.

(56) References Cited

U.S. PATENT DOCUMENTS

2008/0079009 A1* 4/2008 Yaegashi ........... H01L 21/02378
257/77
(Continued)

FOREIGN PATENT DOCUMENTS

JP 2008-041834 2/2008
JP 2008-091595 4/2008
(Continued)

OTHER PUBLICATIONS

International Search Report of PCT application No. PCT/JP2014/003233 dated Sep. 16, 2014.

*Primary Examiner* — Khiem D Nguyen
(74) *Attorney, Agent, or Firm* — McDermott Will & Emery LLP

(57) ABSTRACT

A semiconductor device includes a substrate, a first nitride semiconductor layer formed on the substrate, a p-type nitride semiconductor layer formed on the first nitride semiconductor layer, a recess having a bottom portion which reaches the first nitride semiconductor layer through a part of the p-type nitride semiconductor layer, a third nitride semiconductor layer formed to cover the bottom portion of the recess, a side portion of the recess, and a part of an upper surface of the p-type nitride semiconductor layer. The semiconductor device further includes a fourth nitride semiconductor layer formed on the third nitride semiconductor layer, a first electrode formed on another side of the substrate, a gate electrode formed on the upper surface of the p-type nitride semiconductor layer, and a second electrode that is in contact with the third nitride semiconductor layer or the fourth nitride semiconductor layer. The third nitride semiconductor layer has a bandgap different from a bandgap of the fourth nitride semiconductor layer.

10 Claims, 4 Drawing Sheets

(51) Int. Cl.
*H01L 29/20* (2006.01)
*H01L 29/205* (2006.01)

(56) References Cited

U.S. PATENT DOCUMENTS

2011/0089468 A1* 4/2011 Zhang ............... H01L 29/42316
257/194
2011/0241017 A1* 10/2011 Ikeda .................. H01L 29/0847
257/76
2012/0146095 A1* 6/2012 Park .................. H01L 29/41766
257/194
2013/0056746 A1 3/2013 Joshin

FOREIGN PATENT DOCUMENTS

JP 2010-097974 4/2010
JP 2013-055148 3/2013

* cited by examiner

GROUP III NITRIDE SEMICONDUCTOR DEVICE WHICH CAN BE USED AS A POWER TRANSISTOR

RELATED APPLICATIONS

This application is a Continuation of International Application No. PCT/JP2014/003233, filed on Jun. 17, 2014, which in turn claims priority from Japanese Patent Application No. 2013-146125, filed on Jul. 12, 2013, the contents of all of which are incorporated herein by reference in their entireties.

BACKGROUND

1. Field of the Invention

The present disclosure relates to a semiconductor device, and more particularly to a group III nitride semiconductor device which can be used as a power transistor.

2. Description of the Related Art

A group III nitride semiconductor represented by GaN or AlGaN has wide bandgap, and high breakdown voltage. Furthermore, with the group III nitride semiconductor, a hetero structure such as AlGaN/GaN layers can be readily formed, and a high-concentration electron channel (two-dimensional electron gas which is referred to as 2DEG below) is generated in the GaN layer near an interface of the AlGaN/GaN layers due to piezoelectric charges generated from a difference in lattice constant between the AlGaN and the GaN layers, and a difference in bandgap between the AlGaN and the GaN layers. Thus, in an electron device using the group III nitride semiconductor, a large-current operation and a high-speed operation can be performed. As a result, the group III nitride semiconductor can be expected to be used in an electron device such as a power field effect transistor (FET) and a diode.

In addition, since a large-diameter free-standing GaN substrate has not been available before, an epitaxial substrate formed on a SiC, sapphire, or Si substrate has been used in a lateral AlGaN/GaN-HFET in general. However, the large-diameter free-standing GaN substrate has been recently put into practical use, so that a vertical GaN-FET starts to draw attention because a chip size can be miniaturized, and costs can be reduced.

As one example of the vertical GaN-FET, FIG. 1 shows a cross-sectional structure of a vertical HFET made of compound semiconductor disclosed in Unexamined Japanese Patent Publication No. 2010-97974. Channel layer 2 (made of i-GaN) is formed on appropriate substrate 1 (made of n-GaN), and carrier supply layer 6 (made of AlGaN) having a bandgap greater than channel layer 2 is formed along channel layer 2. Thus, 2DEG layer 7 is generated due to a difference in bandgap between carrier supply layer 6 and channel layer 2. Insulating layer 11, gate electrode 10, insulating layer 11 are sequentially formed from a bottom, on substrate 1 along carrier supply layer 6. In addition, electrode 8 (a drain or source) is formed on a bottom surface and makes an ohmic contact with substrate 1, and electrode 9 (drain or source) is formed on upper surfaces of channel layer 2 and carrier supply layer 6 and makes an ohmic contact with 2DEG layer 7. Gate electrode 10 makes a Schottky contact with carrier supply layer 6.

Regarding an operation of the vertical HFET, a voltage is applied to electrode 10 to form a depletion layer (not shown) across a Schottky barrier, whereby a current in 2DEG layer 7 is controlled. Thus, a current between ohmic-contacting electrode 8 and ohmic-contacting electrode 9 is controlled. The FET in which the 2DEG channel is controlled is generally called a high electron mobility transistor (HEMT). According to this structure disclosed in the Unexamined Japanese Patent Publication No. 2010-97974, since a gate length is defined as a thickness of gate electrode 10, a short gate can be readily manufactured, so that a high-speed operation can be performed.

SUMMARY

A semiconductor device in one aspect of the present disclosure includes a substrate, a first nitride semiconductor layer formed on the substrate, a p-type nitride semiconductor layer formed on the first nitride semiconductor layer, a recess having a bottom portion which reaches the first nitride semiconductor layer through a part of the p-type nitride semiconductor layer, a third nitride semiconductor layer formed to cover the bottom portion of the recess, a side portion of the recess, and a part of an upper surface of the p-type nitride semiconductor layer. The semiconductor device further includes a fourth nitride semiconductor layer formed on the upper surface of the third nitride semiconductor layer, a first electrode formed on a rear surface of the substrate, a gate electrode formed on the upper surface of the p-type nitride semiconductor layer, and a second electrode that is in contact with the third nitride semiconductor layer or the fourth nitride semiconductor layer, in which the third nitride semiconductor layer has a bandgap different from a bandgap of the fourth nitride semiconductor layer.

Thus, since a pn junction is formed between the p-type nitride semiconductor layer and the third nitride semiconductor layer, a forward voltage (Vf: voltage which can be applied in a forward direction) is considerably improved, and since a 2DEG layer is formed in an interface between the third nitride semiconductor layer and the fourth nitride semiconductor layer, the pn junction is sandwiched between the gate electrode and the 2DEG layer, so that a concentration of 2DEG can be reduced by a depletion layer in the pn junction, and a normally-OFF operation can be readily implemented.

Furthermore, according to the semiconductor device in the one aspect of the present disclosure, the fourth nitride semiconductor layer may have the bandgap greater than the bandgap of the third nitride semiconductor layer.

Furthermore, according to the semiconductor device in the one aspect of the present disclosure, the third nitride semiconductor layer may have the bandgap greater than the bandgap of the fourth nitride semiconductor layer.

Furthermore, according to the semiconductor device in the one aspect of the present disclosure, between the third nitride semiconductor layer and the fourth nitride semiconductor layer, a thickness of the nitride semiconductor layer having the greater bandgap may be locally thick.

Thus, the nitride semiconductor layer having the greater bandgap serves as a carrier supply layer, and the concentration of the 2DEG layer in a channel layer that is in contact with the carrier supply layer formed along the bottom portion of the recess, and in a channel layer that is in contact with the carrier supply layer formed along the upper surface of the p-type nitride semiconductor layer can be locally increased in comparison with the concentration of the 2DEG layer in a channel layer that is in contact with the carrier supply layer formed along the side portion of the recess.

Furthermore, according to the semiconductor device in the one aspect of the present disclosure, between the third nitride semiconductor layer and the fourth nitride semiconductor layer, a thickness of the nitride semiconductor layer having the narrower bandgap may be locally thin in a position that is in contact with the p-type nitride semiconductor layer.

Thus, the concentration of the 2DEG layer in a channel layer that is in contact with the carrier supply layer formed along the bottom portion of the recess, and in a channel layer that is in contact with the carrier supply layer formed along the upper surface of the p-type nitride semiconductor layer can be locally increased in comparison with the concentration of the 2DEG layer in a channel layer that is in contact with the carrier supply layer formed along the side portion of the recess.

According to the semiconductor device in the one aspect of the present disclosure, the side portion of the recess may have a tapered angle that falls within a range from 40 degrees to 80 degrees both inclusive.

Thus, the carrier supply layer along the side of the recess can be thinned in a self-aligned process in comparison with the carrier supply layer formed along the bottom portion of the recess and the carrier supply layer formed along the upper surface of the p-type nitride semiconductor layer, so that a device having both characteristics of a normally-OFF operation and a low ON-resistance can be manufactured in one regrowth process.

The semiconductor device in the one aspect of the present disclosure, further includes a fifth nitride semiconductor layer between the first nitride semiconductor layer and the p-type nitride semiconductor layer, and the fifth nitride semiconductor layer may have a bottom portion located above the bottom portion of the recess.

According to the semiconductor device in the one aspect of the present disclosure, since the p-type semiconductor is sandwiched between the gate electrode and the 2DEG layer, compared to a MES (metal-semiconductor) structure having a Schottky contact, the forward voltage (Vf) is considerably improved. At the same time, since the pn junction is sandwiched between the gate electrode and the 2DEG layer, the 2DEG concentration is reduced due to the depletion layer in the pn junction, so that the normally-OFF operation can be readily implemented. Thus, a great potential difference can be obtained between the forward voltage Vf and a threshold voltage (Vth), so that the normally-OFF operation and a large-current operation can be both implemented. Furthermore, since the pn junction is sandwiched between the gate electrode and the 2DEG layer, a gate leak current can be considerably reduced. In addition, in this structure, since the 2DEG channel can be controlled depending on an epitaxial film thickness of the p-type semiconductor, an extremely short gate length can be readily manufactured, so that a high-speed operation can be performed.

DETAILED DESCRIPTION OF THE PREFERRED EMBODIMENTS

Figure 1:
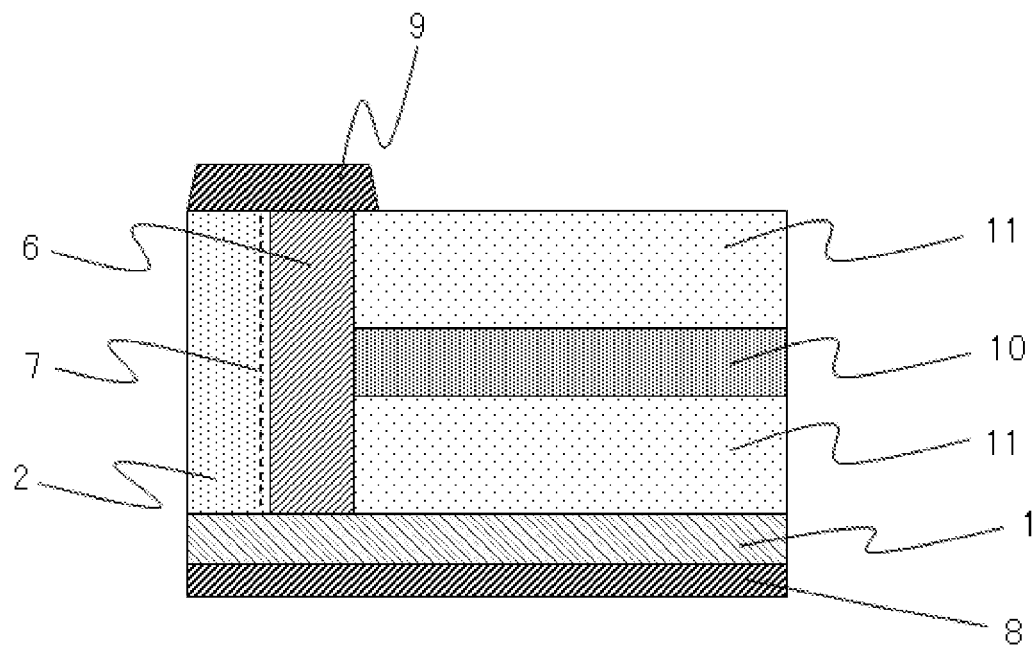
FIG. 1 is a view illustrating a cross-sectional structure of a conventional semiconductor device.

In a case where a semiconductor device disclosed in Unexamined Japanese Patent Publication No. 2010-97974 is used in a field of power devices, some problems arise. First, in the field of power devices, in view of safety of an equipment that power devices are mounted, it is required that a drain current does not flow when a gate voltage is 0 V, which is called a normally-OFF operation (also called an enhancement mode operation). However, in the structure in FIG. 1, a threshold voltage (Vth) depends on a thickness and a composition of carrier supply layer 6. In order to drive the device in a normally-OFF operation (Vth>0 V), carrier supply layer 6 needs to be considerably thinned, and a 2DEG density is reduced in 2DEG layer 7, so that a large-current operation is difficult to perform. Furthermore, as carrier supply layer 6 is thinned, a current is more likely to pass through carrier supply layer 6 when a high voltage of the drain electrode is applied, and as a result, a gate leak current is increased. Furthermore, a barrier height is no more than a voltage of a Schottky contact, so that although a forward voltage (Vf) is low, the threshold voltage Vth is high. In this case, a difference is hardly generated between them, so that the problem is that a drain current itself is hardly provided.

Hereinafter, exemplary embodiments of the semiconductor device in the present disclosure to solve the above problems will be described with reference to the drawings.

First Exemplary Embodiment

Figure 2:
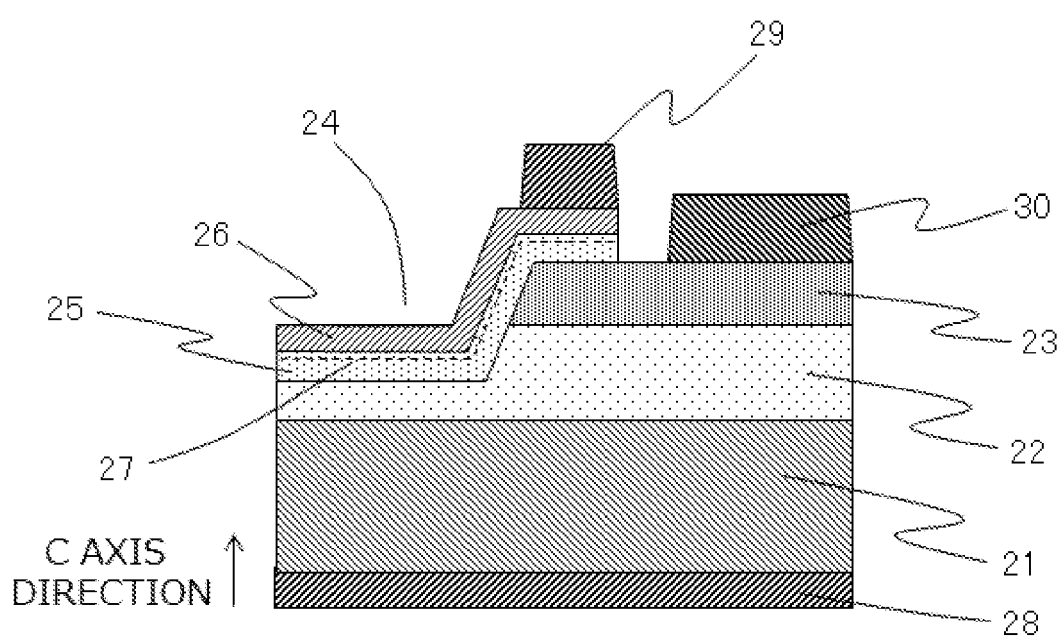
FIG. 2 is a view illustrating a cross-sectional structure of a semiconductor device in a first exemplary embodiment.

FIG. 2 shows a cross-sectional structure of a semiconductor device according to the first exemplary embodiment. The semiconductor device in this exemplary embodiment is an FET serving as an inverted-type vertical HEMT in which a 2DEG channel is depleted from a side direction. In addition, a minimum configuration is shown in this structure and the structure is not limited to this. Furthermore, a group III nitride semiconductor is used in describing this exemplary embodiment, but the present disclosure is not limited to this.

In this structure, stacked layers including first channel layer 22 and gate layer 23 are formed on substrate 21. Substrate 21 has an appropriate thickness, and is made of n-type GaN in which Si is doped as an impurity at a concentration of $1 \times 10^{18}$ cm$^{-3}$, and its main surface has a plane orientation (0001). First channel layer 22 has a thickness of 2 μm, and is made of n-type GaN in which Si is doped as an impurity at a concentration of $1 \times 10^{18}$ cm$^{-3}$. Gate layer 23, which is formed on first channel layer 22, has a thickness of 200 nm, and is made of p-type GaN in which Mg is doped as an impurity at a concentration of $5 \times 10^{19}$ cm$^{-3}$ to $10 \times 10^{19}$ cm$^{-3}$. First channel layer 22 and p-type gate layer 23 are formed on substrate 21 by an appropriate crystal growth technique such as MOCVD (metal-organic chemical vapor deposition) method or MBE (molecular beam epitaxy) method. Recess 24 is formed so as to penetrate p-type gate layer 23 from the upper surface of the stacked layers until a bottom portion of recess 24 reaches first channel layer 22. Second channel layer 25 having a thickness of 100 nm and made of i-type GaN is formed so as to cover an inside of recess 24 (a bottom portion of recess 24 and a side portion of recess 24) and a part of an upper surface of p-type gate layer 23. Furthermore, carrier supply layer 26 is formed so as to cover second channel layer 25. Carrier supply layer 26 has a bandgap greater than a bandgap of second channel layer 25. Carrier supply layer 26 has a thickness of several nm to several 10 nm, and is made of i-type $Al_{0.18}Ga_{0.82}N$. Here, the i-type means that an impurity is not doped, that is, an intrinsic type. High-concentration 2DEG layer 27 is generated in second channel layer 25 in a vicinity of an interface with carrier supply layer 26 due to a bandgap difference and a piezo-electric field between second channel layer 25 and carrier supply layer 26. Second channel layer 25 and carrier supply layer 26 are formed by an appropriate crystal growth technique such as MOCVD method or MBE method. Here, a gate length means a length of a side surface of gate layer 23 which is in contact with second channel layer 25. When a thickness of gate layer 23 is 200 nm and a tapered angle (angle formed between the side surface and a bottom surface of gate layer 23) is 30°, the gate length is 400 nm, which is two times longer than the thickness of gate layer 23.

Electrode 28 is formed on a rear surface of substrate 21 (a lower side in the drawing) and makes an ohmic contact with substrate 21, and electrode 29 is formed on carrier supply layer 26 and makes an ohmic contact with carrier supply layer 26 in a region except for recess 24. In addition, ohmic-contacting electrode 28 and ohmic-contacting electrode 29 may be a source electrode or a drain electrode, such as when ohmic-contacting electrode 28 is the source electrode, ohmic-contacting electrode 29 is the drain electrode, and when ohmic-contacting electrode 28 is the drain electrode, ohmic-contacting electrode 29 is the source electrode. Furthermore, gate electrode 30 is formed on an upper surface of p-type gate layer 23.

Since substrate 21 and first channel layer 22 serve as channels, they preferably have low resistance to some extent. In general, the nitride semiconductor GaN used in these layers shows an n type in an intentionally undoped state, but n-type resistivity may be adjusted by doping an n-type dopant such as Si within a range from $1\times10^{16}$ $cm^{-3}$ to $1\times10^{20}$ $cm^{-3}$. In addition, in the case where substrate 21 is made of n-type GaN, first channel layer 22 is not always needed because an upper portion in the substrate 21 can work as a channel.

High-concentration 2DEG layer 27 is generated in second channel layer 25 due to the bandgap difference and the piezo-electric field between second channel layer 25 and carrier supply layer 26, so that second channel layer 25 does not necessarily have low resistance. However, when a current flows from 2DEG layer 27 to first channel layer 22 in the bottom portion of recess 24, it is necessary to pass through carrier supply layer 26 in a vertical direction. Since the resistance at that time directly affects ON-resistance of the device, the resistance of second channel layer 25 is preferably low to some extent.

In the case where second channel layer 25 is made of nitride semiconductor GaN, an un-intentionally doped n type is provided because an impurity is mixed even in an intentionally undoped (intrinsic) state due to a residual impurity (mainly carbon group or oxygen group) during a crystal growth. However, its n-type resistivity may be adjusted by doping an n-type dopant such as Si within a range from $1\times10^{16}$ $cm^{-3}$ to $5\times10^{18}$ $cm^{-3}$.

Furthermore, in the case where p-type gate layer 23 is made of nitride semiconductor, it is doped with Mg or Zn to provide the p type. Each of second channel layer 25 and carrier supply layer 26 does not necessarily have an uniform thickness, and it may have uneven thickness such as having a small thickness on the side portion of recess 24. The thickness of second channel layer 25 is defined as a thickness in a perpendicular direction to the bottom surface of second channel layer 25 at a measurement point. For example, in a case where the side portion of recess 24 is inclined at 60 degrees with respect to a horizontal direction (a lateral direction in the drawing, or a bottom surface) of substrate 21, the thickness of second channel layer 25 along the side portion of recess 24 is a thickness in a direction inclined at 150 degrees with respect to the horizontal direction (the lateral direction in the drawing).

Each of ohmic-contacting electrode 28 and ohmic-contacting electrode 29 is made of metal such as Ti, Al, Mo, and Hf, or two or more mixed metals thereof in the case where substrate 21 and carrier supply layer 26, which are in contact with the above electrodes, respectively, are made of n-type nitride semiconductor. In addition, ohmic-contacting electrode 29 is not necessarily formed on the upper surface of carrier supply layer 26, and it may be directly in contact with 2DEG layer 27 through an ohmic recess formed in carrier supply layer 26. Furthermore, ohmic-contacting electrode 28 and ohmic-contacting electrode 29 do not necessarily make the ohmic contact, and either one or both of them may make a Schottky contact, and in this case, the electrode is made of one metal or two or more mixed metals of Ti, Ni, Pd, and Au. Furthermore, gate electrode 30 is made of metal such as Ti, Al, Ni, Pt, Pd, and Au, or two or more mixed metals thereof in the case where gate layer 23 which is to be in contact with gate electrode 30 is made of p-type nitride semiconductor, and gate electrode 30 may make an ohmic contact or a Schottky contact with p-type gate layer 23.

As for an FET operation in this structure, in the case where ohmic-contacting electrode 28 serves as the drain electrode, and ohmic-contacting electrode 29 serves as the source electrode, when a high negative voltage is applied to gate electrode 30, a large depletion layer is formed in a pn junction near an interface between p-type gate layer 23 and second channel layer 25. As the depletion layer is expanded in second channel layer 25, 2DEG layer 27 is depleted. Even when a potential difference is applied between the drain and the source in this state, a drain current does not flow because the channel is blocked in second channel layer 25 with the depletion layer expanded by the gate voltage. Subsequently, as the voltage to gate electrode 30 is gradually increased to a positive voltage, the depletion layer in the pn junction expanded in second channel layer 25 becomes small, and a current starts to flow in second channel layer 25. The voltage to gate electrode 30 at which the current starts to flow is called the threshold voltage. As the gate voltage is increased to the positive voltage beyond the threshold voltage (Vth), the drain current starts to flow. When the threshold voltage shows the positive value, it is found that the normally-OFF operation is implemented. In order to implement the normally-OFF operation, it is important to control various parameters such as a thickness and a Si doping amount of second channel layer 25, a Mg doping amount and a Mg activation rate of p-type gate layer 23, and a bandgap, an Al composition, a thickness, and a Si doping amount of carrier supply layer 26. Furthermore, the thickness of p-type gate layer 23 is substantially equivalent to an effective gate length, and as the thickness is reduced, the effective gate length is reduced, whereby a high-speed operation can be performed. However, when the thickness becomes too small, a short channel effect is generated, so that it is also important to control the thickness of p-type gate layer 23.

In this structure, when gate layer 23 has a Mg doping amount of $5\times10^{19}$ $cm^{-3}$ to $10\times10^{19}$ $cm^{-3}$, and carrier supply layer 26 has an Al composition of 18% and a thickness of 20 nm or less, for example, the normally-OFF operation can be implemented in this semiconductor device.

In this structure, since the pn junction between gate layer 23 and second channel layer 25 is sandwiched between gate electrode 30 and 2DEG layer 27, compared to a general MES structure having a Schottky contact, a forward voltage Vf can be considerably improved. And since the pn junction is sandwiched between gate electrode 30 and 2DEG layer 27, the 2DEG concentration is reduced due to the depletion layer in the pn junction, whereby the normally-OFF operation can be readily implemented. Thus, a great potential difference can be obtained between Vf and Vth, so that the normally-OFF operation and a large-current operation can be both implemented. In addition, unlike the structure of the conventional technique disclosed in the Unexamined Japanese Patent Publication No. 2010-97974, 2DEG layer 27 in second channel layer 25 can be controlled directly from another side of second channel layer 25 instead of being controlled from a side having a band barrier difference generated due to a difference in bandgap between second channel layer 25 and carrier supply layer 26 (this structure is called an inverted type HEMT structure or an inverted type HFET structure), so that the gate voltage is highly controllable, and the normally-OFF operation can be more readily implemented. Furthermore, since 2DEG layer 27 is directly controlled from the other side of second channel layer 25 in this structure, it is not necessary to consider the thickness of carrier supply layer 26 in implementing the normally-OFF operation. Furthermore, since the above pn junction is sandwiched between gate electrode 30 and 2DEG layer 27, a gate leak current can be considerably reduced. Furthermore, the channel is controlled by p-type gate layer 23 from the lateral direction, the gate length can be substantially determined by the thickness of gate layer 23. Thus, the gate length can be readily shortened, so that the high-speed operation can be performed.

In addition, substrate 21 may be made of AlInGaN, SiC, Si, or GaAs other than GaN. Furthermore, the conductivity type of substrate 21 is not limited to the n type. For example, a semi-insulating substrate or an insulating substrate may be used as substrate 21. Furthermore, in a case where the conductivity type of substrate 21 is the p type, the conductivity type of each layer formed thereon is to be inverted, but the layer structure is not changed.

Furthermore, substrate 21 is doped with Si in the above, but any dopant other than Si may be used as long as it shows the n conductivity type.

In addition, first channel layer 22 is made of n-type GaN in the above, but it may be made of InGaN, AlGaN, or AlInGaN other than GaN.

Furthermore, first channel layer 22 is doped with Si in the above, but any dopant other than Si may be used as long as it shows the n conductivity type.

Moreover, gate layer 23 is made of p-type GaN in the above, but it may be made of InGaN, AlGaN, or AlInGaN other than GaN. In addition, the impurity concentration of gate layer 23 is set to $5 \times 10^{19}$ cm$^{-3}$ to $10 \times 10^{19}$ cm$^{-3}$ in the above, the value is only one example, and the concentration is not limited to this value.

Furthermore, gate layer 23 is doped with Mg in the above, but any dopant other than Mg may be used as long as it shows the p conductivity type.

Furthermore, the thickness of gate layer 23 is 200 nm in the above, that value is only one example, and the thickness is not limited to this value. In addition, a desired thickness of gate layer 23 falls within a range from 100 nm to 1 μm inclusive.

Second channel layer 25 may be made of n-type GaN, n-type InGaN, n-type AlGaN, and n-type AlInGaN other than i-type GaN. A desired thickness of second channel layer 25 falls within a range from 100 nm to 1 μm inclusive.

Carrier supply layer 26 only needs to have the bandgap greater than the bandgap of second channel layer 25, and may be made of i-type AlGaN, n-type AlGaN, or n-type AlInGaN.

First Variation of First Exemplary Embodiment

Figure 3:
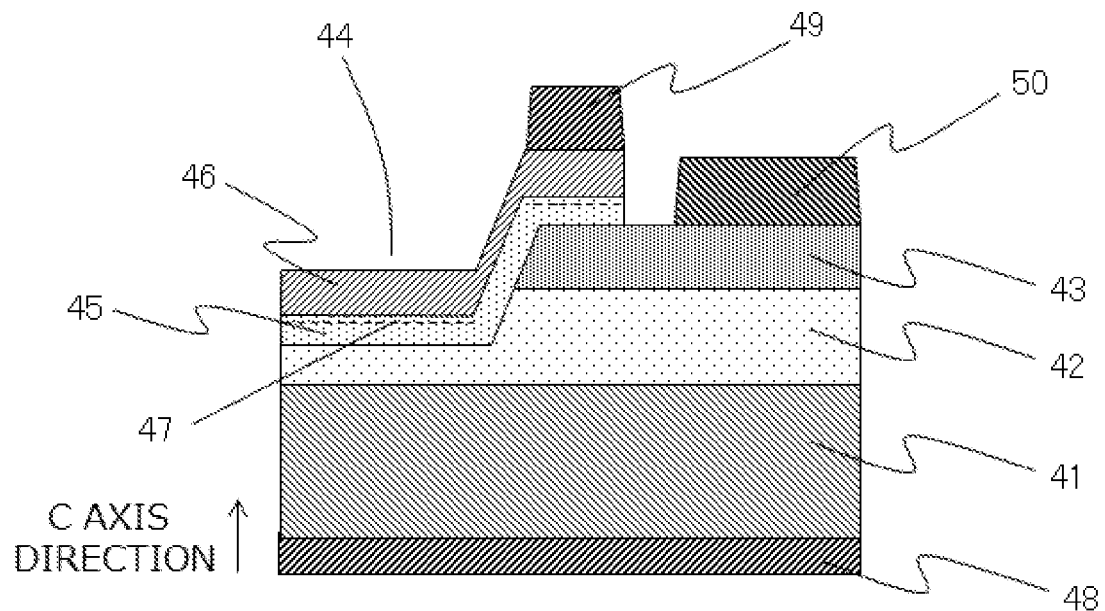
FIG. 3 is a view illustrating a cross-sectional structure of a semiconductor device in a first variation of the first exemplary embodiment.

FIG. 3 shows a cross-sectional structure of a semiconductor device in the first variation of the first exemplary embodiment shown in FIG. 2. The semiconductor device in this variation is an FET serving as an inverted-type vertical HEMT in which a 2DEG layer is depleted from a side direction, and a carrier supply layer is partially thick. In addition, a minimum configuration is shown in this structure and the structure is not limited to this. Furthermore, a group III nitride semiconductor is used in describing this exemplary embodiment, but the present disclosure is not limited to this.

This structure differs from the structure shown in FIG. 2 in that a thickness of carrier supply layer 26 is not uniform. More specifically shown in FIG. 3, both a part of carrier supply layer 46 formed along a bottom portion of recess 44 and a part of carrier supply layer 46 formed along an upper surface of p-type gate layer 43 are thicker than a part of carrier supply layer 46 formed along a side portion of recess 44.

In this structure, a concentration in 2DEG layer 47 along the side portion of recess 44 is varied by adjusting the thickness and an Al composition of carrier supply layer 46 (in a case where carrier supply layer 46 is made of AlGaN) so that an appropriate Vth can be obtained. For example, in this structure, in order to implement the normally-OFF operation, the thickness and the Al composition of carrier supply layer 46 (in the case where carrier supply layer 46 is made of AlGaN) are adjusted so that the concentration in 2DEG layer 47 is substantially eliminated along the side portion of recess 44 when a gate voltage is at 0 V. In other words, by locally thickening carrier supply layer 46 formed along the bottom portion of recess 44, and carrier supply layer 46 formed along the upper surface of p-type gate layer 43 in comparison with carrier supply layer 46 formed along the side portion of recess 44, the concentration of 2DEG layer 47 in channel layer 45 that is in contact with carrier supply layer 46 formed along the bottom portion of recess 44, and in channel layer 45 that is in contact with carrier supply layer 46 formed along the upper surface of p-type gate layer 43 can be locally increased in comparison with the concentration of 2DEG layer 47 in channel layer 45 that is in contact with carrier supply layer 46 formed along the side portion of recess 44. As a result, resistance between the source and the drain can be reduced, and ON-resistance of the device can be reduced. That is, by locally increasing or reducing the thickness of carrier supply layer 46, the 2DEG concentration in the 2DEG layer 47 can be locally increased or reduced. Consequently, it becomes possible to manufacture a device having both characteristics of the normally-OFF operation and low ON-resistance.

In this structure, after recess 44 has been formed, second channel layer 45 and carrier supply layer 46 are formed in a regrowth process by an appropriate crystal growth technique such as MOCVD or MBE method. At the time when the regrowth process is performed in recess 44 having a steep tapered angle at the side portion (that is an angle of the side portion of recess 44 with respect to a bottom surface of substrate 41 (provided in a lateral direction in the drawing)) by a method such as MOCVD method, the thickness of carrier supply layer 46 can be locally increased or reduced in a self-aligned process by differentiating a growth rate between a direction perpendicular to the bottom surface of substrate 41

(vertical direction), and a horizontal direction (lateral direction) in a regrowth condition. In the MOCVD method, when a group III nitride semiconductor containing Al such as AlGaN is grown, the growth rate in the lateral direction is much lower than that in the vertical direction in general. Therefore, when carrier supply layer 46 is made of AlGaN (or group III nitride semiconductor containing Al), and the tapered angle is formed to some extent at the side portion of recess 44, carrier supply layer 46 along the side portion of the recess 44 can be thinned in the self-aligned process in comparison with carrier supply layer 46 formed along the bottom portion of recess 44 and carrier supply layer 46 formed along the upper surface of p-type nitride semiconductor layer 43, so that it becomes possible to provide a device having both characteristics of the normally-OFF operation and the low ON-resistance in the one regrowth process. More specifically, when the tapered angle is smaller than 20 degrees, the thicknesses of carrier supply layer 46 (made of AlGaN, for example) are substantially the same in the side portion and the bottom portion of recess 44. Meanwhile, when the tapered angle is greater than 85 degrees, the thickness of carrier supply layer 46 (made of AlGaN, for example) hardly grows at the side portion of recess 44, and piezoelectric charges to bring electrons together in a lower portion of carrier supply layer 46 are not generated, so that there is almost no concentration in 2DEG layer 47 along the side portion of recess 44. Thus, in order to locally increase or reduce the thickness of carrier supply layer 46 in the self-aligned process, the tapered angle at the side portion of recess 44 preferably falls within a range from 20 degrees to 85 degrees inclusive, and more preferably from 40 degrees to 80 degrees inclusive.

Second Variation of First Exemplary Embodiment

Figure 4:
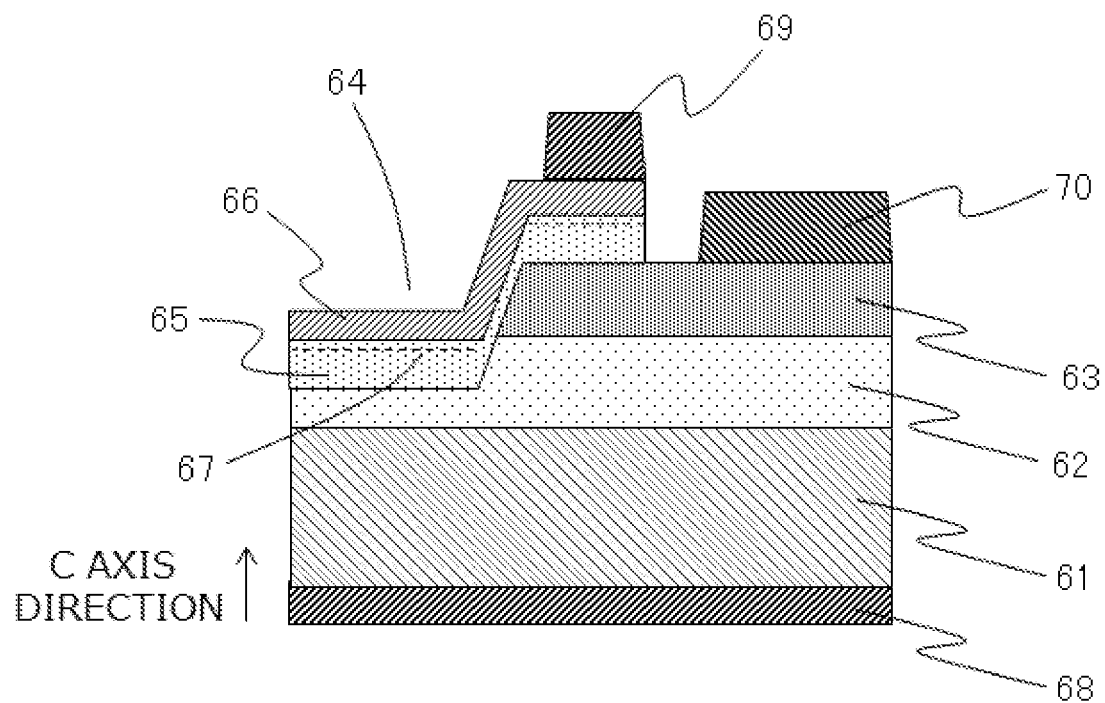
FIG. 4 is a view illustrating a cross-sectional structure of a semiconductor device in a second variation of the first exemplary embodiment.

FIG. 4 shows a cross-sectional structure of a semiconductor device in the second variation of the first exemplary embodiment shown in FIG. 2. The semiconductor device in this variation is an FET serving as an inverted-type vertical HEMT in which a 2DEG layer is depleted from a side direction, and a channel layer is partially thin. In addition, a minimum configuration is shown in this structure and the structure is not limited to this. Furthermore, a group III nitride semiconductor is used in describing this exemplary embodiment, but the present disclosure is not limited to this.

This structure differs from the structure shown in FIG. 2 in that a thickness of second channel layer 25 is not uniform. More specifically shown in FIG. 4, a part of second channel layer 65 along a side portion of recess 64 is locally thinned in comparison with a part of channel layer 65 formed along a bottom portion of recess 64 and channel layer 67 formed along the upper surface of p-type nitride semiconductor layer 63.

Thus, a physical distance between p-type gate layer 63 and 2DEG layer 67 in second channel layer 65 is small, and carriers are confined in a considerably thin region in second channel layer 65 along the side portion of recess 64, so that a gate voltage is highly controllable, and the normally-OFF operation can be more readily implemented.

Third Variation of First Exemplary Embodiment

Figure 5:
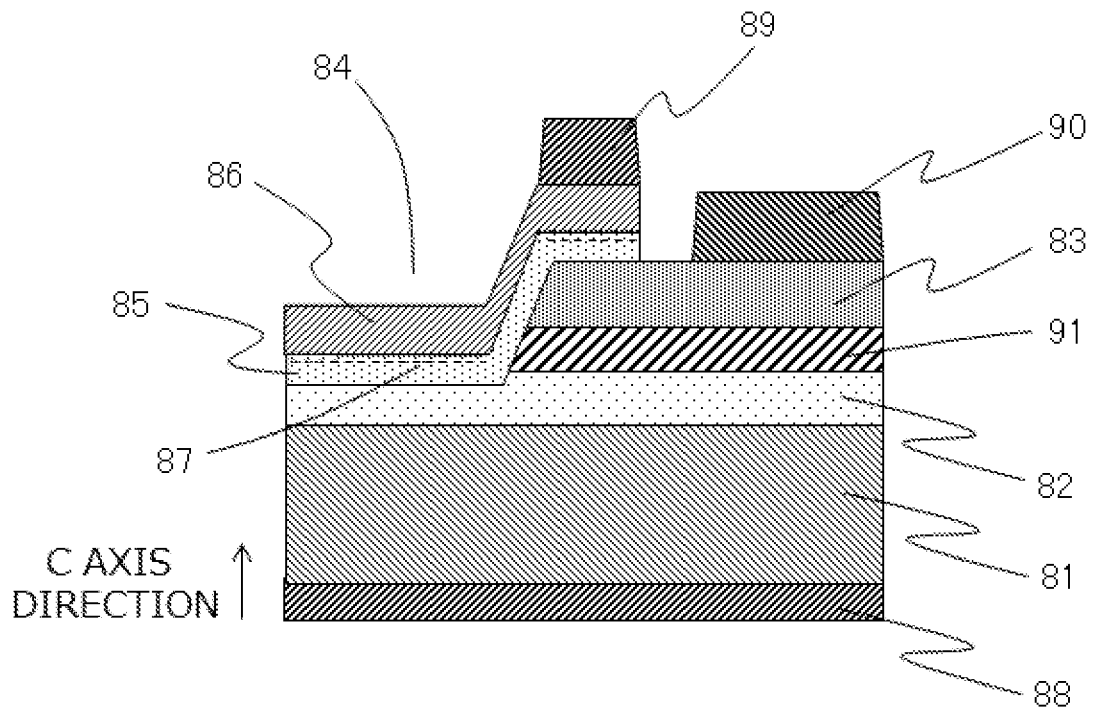
FIG. 5 is a view illustrating a cross-sectional structure of a semiconductor device in a third variation of the first exemplary embodiment.

FIG. 5 shows a cross-sectional structure of a semiconductor device in the third variation of the first exemplary embodiment shown in FIG. 2. The semiconductor device in this variation is an FET serving as an inverted-type vertical HEMT in which a SL (super lattice) layer is formed, and a 2DEG layer is depleted from a side direction. In addition, a minimum configuration is shown in this structure and the structure is not limited to this. Furthermore, a group III nitride semiconductor is used in describing this exemplary embodiment, but the present disclosure is not limited to this.

Figure 6:
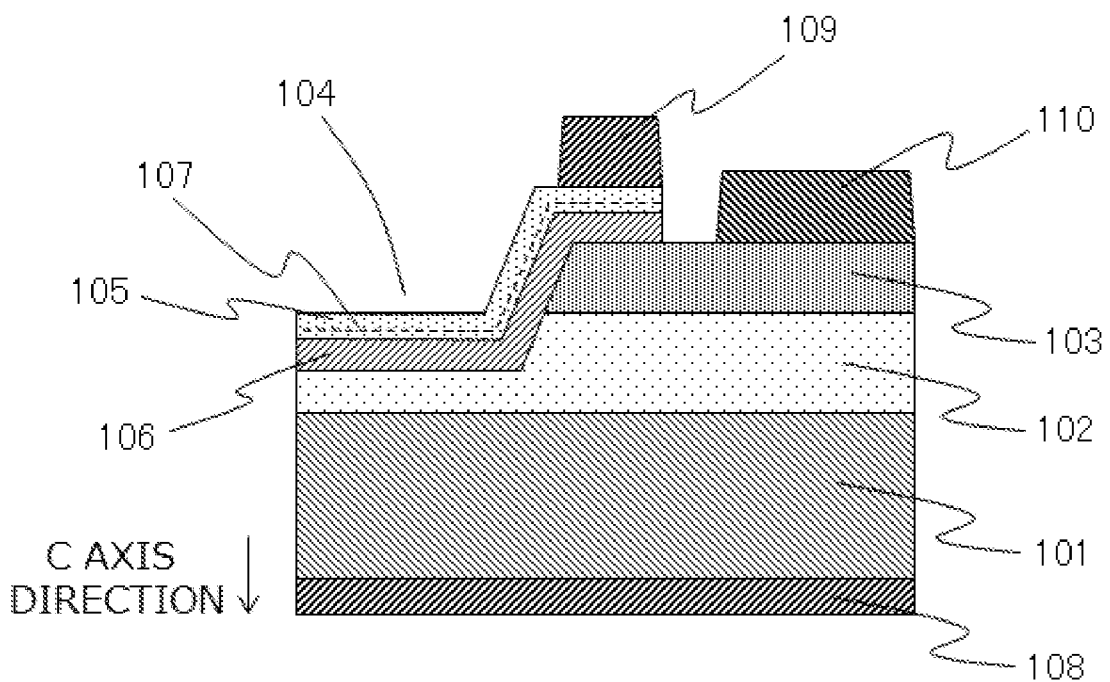
FIG. 6 is a view illustrating a cross-sectional structure of a second exemplary embodiment.

This structure provides normal SL layer 91 made of AlGaN/GaN or AlGaN/AlN between first channel layer 82 and p-type gate layer 83, in comparison with the structure shown in FIG. 6.

Thus, a vertical withstand voltage between ohmic-contacting electrode 88 and gate electrode 90 is improved, so that a gate leak current can be reduced.

In addition, SL layer 91 is not necessarily the SL layer in particular, and it may be a high-resistance AlGaN layer, that is, it may be composed of a single layer or multiple layers made of material such as AlN, InN, GaN, AlGaN, InGaN, and AlInGaN which can improve the vertical withstand voltage between ohmic-contacting electrode 88 and gate electrode 90.

Second Exemplary Embodiment

FIG. 6 shows a cross-sectional structure of a semiconductor device in the second exemplary embodiment. The semiconductor device in this exemplary embodiment is an FET serving as a vertical HEMT in which a 2DEG layer is depleted from a side direction. In addition, a minimum configuration is shown in this structure and the structure is not limited to this. Furthermore, a group III nitride semiconductor is used in describing this exemplary embodiment, but the present disclosure is not limited to this.

In this structure, stacked layers are formed on substrate 101 (made of material such as n-GaN, n-AlInGaN, n-SiC, or Si) in a "−c axis" direction (which is originally a downward direction of the substrate) opposite to a "c axis" direction, and the stacked layers include first channel layer 102 (made of a group III nitride semiconductor such as n-GaN, n-InGan, n-AlGaN, or n-AlInGaN) and p-type gate layer 103 (made of material such as p-GaN, p-InGaN, p-AlGaN, or p-AlInGaN). First channel layer 102 and p-type gate layer 103 are formed on substrate 101 by an appropriate crystal growth technique such as MOCVD method or MBE method. Recess 104 is formed so as to penetrate p-type gate layer 103 from the upper surface of the stacked layers (from an upper part in the drawing) until a bottom portion of recess 104 reaches first channel layer 102. Carrier supply layer 106 (made of group III nitride semiconductor such as i-AlGaN, n-AlGaN, or n-AlInGaN) is formed so as to cover an inside (a bottom portion of recess 104 and a side portion of recess 104) of recess 104 and a part of an upper surface of p-type gate layer 103. Second channel layer 105 (made of group III nitride semiconductor such as i-GaN (i: intrinsic), n-GaN, n-InGaN, n-AlGaN, or n-AlInGaN) is formed so as to cover carrier supply layer 106, and a bandgap of carrier supply layer 106 is greater than a bandgap of second channel layer 105. High-concentration 2DEG layer 107 is generated in second channel layer 105 in a vicinity of an interface with carrier supply layer 106 due to a difference in bandgap and a piezoelectric field between second channel layer 105 and carrier supply layer 106. In this structure, the III group nitride semiconductor layers are stacked in the −c axis direction unlike the first exemplary embodiment. Thus, 2DEG layer 107 is generated in second channel layer 105 of an upper surface of carrier supply layer 106 having the greater bandgap. Second channel layer 105 and carrier supply layer 106 are formed by an appropriate crystal growth technique such as MOCVD method or MBE method.

Furthermore, electrode 108 is formed on a rear surface (a lower side in the drawing) of substrate 101 so as to make an ohmic contact with substrate 101, and electrode 109 is formed on second channel layer 105 in a region except for a region over recess 104 so as to make an ohmic contact with second channel layer 105. Furthermore, ohmic-contacting electrode 108 and ohmic-contacting electrode 109 may be a source electrode or a drain electrode, such as when ohmic-contacting electrode 108 is the source electrode, ohmic-contacting electrode 109 is the drain electrode, and when ohmic-contacting electrode 108 is the drain electrode, ohmic-contacting electrode 109 is the source electrode. Furthermore, gate electrode 110 is formed on an upper surface of p-type gate layer 103.

Since substrate 101 and first channel layer 102 serve as channels, they preferably have low resistance to some extent. In general, the nitride semiconductor GaN used in these layers shows an n type in an intentionally undoped state, but n-type resistivity may be adjusted by doping an n-type dopant such as Si within a range from $1\times10^{16}$ cm$^{-3}$ to $1\times10^{20}$ cm$^{-3}$. In addition, in the case where substrate 101 is made of n-type GaN, first channel layer 102 is not always needed because an upper portion in the substrate 101 can work as a channel.

High-concentration 2DEG layer 107 is generated in second channel layer 105 due to a bandgap difference and piezoelectric field between second channel layer 105 and carrier supply layer 106, so that second channel layer 105 does not necessarily have low resistance. However, when a current flows to 2DEG layer 107 formed under ohmic-contacting electrode 109, it is necessary to pass through second channel layer 105 in a vertical direction. Since resistance at that time directly affects ON-resistance of the device, the resistance of second channel layer 105 is preferably low to some extent. In a case where second channel layer 105 is made of nitride semiconductor GaN, the n type is provided even in an intentionally undoped state, but n-type resistivity may be adjusted by doping an n-type dopant such as Si within a range from $1\times10^{16}$ cm$^{-3}$ to $5\times10^{18}$ cm$^{-3}$. Furthermore, in a case where p-type gate layer 103 is made of nitride semiconductor, it is doped with Mg or Zn to provide the p type. Each of second channel layer 105 and carrier supply layer 106 does not necessarily have an uniform thickness, and it may have an uneven thickness such as having a small thickness on the side portion of recess 104. The thickness of second channel layer 105 is defined as a thickness in a perpendicular direction to the bottom surface of second channel layer 105 at a measurement point. For example, in a case where the side portion of recess 104 is inclined at 60 degrees with respect to a horizontal direction (a lateral direction in the drawing, or a bottom surface) of substrate 101, the thickness of second channel layer 105 along the side portion of recess 104 is a thickness in a direction inclined at 150 degrees with respect to the horizontal direction (the lateral direction in the drawing).

Each of ohmic-contacting electrode 108 and ohmic-contacting electrode 109 is made of metal such as Ti, Al, Mo, and Hf, or two or more mixed metals thereof in the case where substrate 101 and carrier supply layer 105, which are in contact with the above electrodes, respectively, are made of n-type nitride semiconductor. In addition, ohmic-contacting electrode 109 is not necessarily formed on the upper surface of second channel layer 105, and it may be directly in contact with 2DEG layer 107 through a known ohmic recess formed in second channel layer 105. Furthermore, ohmic-contacting electrode 108 and ohmic-contacting electrode 109 do not necessarily make the ohmic contact, and either one or both of them may make a Schottky contact, and in this case, the electrode is made of one metal or two or more mixed metals of Ti, Ni, Pd, and Au. Furthermore, gate electrode 110 is made of metal such as Ti, Al, Ni, Pt, Pd, and Au, or two or more mixed metals thereof in the case where p-type gate layer 103 which is to be in contact with gate electrode 110 is made of p-type nitride semiconductor, and gate electrode 110 may make an ohmic contact or a Schottky contact with p-type gate layer 103.

As for an FET operation in this structure, in the case where ohmic-contacting electrode 108 serves as the drain electrode, and ohmic-contacting electrode 109 serves as the source electrode, when a high negative voltage is applied to gate electrode 110, a large depletion layer is formed in a pn junction near an interface between p-type gate layer 103 and carrier supply layer 106, and a depletion layer is expanded in second channel layer 105 across carrier supply layer 106, and 2DEG layer 107 is depleted. Even when a potential difference is applied between the drain and the source in this state, the drain current does not flow because the channel is blocked in second channel layer 105 with the depletion layer expanded by the gate voltage. Subsequently, as the voltage to gate electrode 110 is gradually increased to a positive voltage, the depletion layer at the pn junction expanded to second channel layer 105 becomes small, and a current starts to flow in second channel layer 105. The voltage to gate electrode 110 at which the current starts to flow is called the threshold voltage. As the gate voltage is increased to the positive voltage beyond the threshold voltage (Vth), the drain current starts to flow. When the threshold voltage shows the positive value, it is found that the normally-OFF operation is implemented. In order to implement the normally-OFF operation, it is important to control various parameters such as a thickness and a Si doping amount of second channel layer 105, a Mg doping amount and a Mg activation rate of p-type gate layer 103, and a bandgap, an Al composition, a thickness, and a Si doping amount of carrier supply layer 106. Furthermore, the thickness of p-type gate layer 103 is substantially equivalent to an effective gate length, and as the thickness is reduced, the effective gate length is reduced, whereby a high-speed operation can be performed. However, when the thickness becomes too small, a short channel effect is caused, so that it is also important to control the thickness of p-type gate layer 103.

In this structure, when gate layer 103 has a Mg doping amount of $5\times10^{19}$ cm$^{-3}$ to $10\times10^{19}$ cm$^{-3}$, and carrier supply layer 106 has an Al composition of 18% and a thickness of 20 nm or less, for example, the normally-OFF operation can be implemented in this semiconductor device.

In this structure, since the pn junction is sandwiched between gate electrode 110 and 2DEG layer 107, compared to a general MES structure having a Schottky contact, a forward voltage Vf can be considerably improved. And since the pn junction between gate layer 103 and carrier supply layer 106 is sandwiched between gate electrode 110 and 2DEG layer 107, the 2DEG concentration is reduced due to the depletion layer in the pn junction, whereby the normally-OFF operation can be readily implemented. Thus, a great potential difference can be obtained between Vf and Vth, so that the normally-OFF operation and a large-current operation can be both implemented. In addition, unlike the structure of the conventional technique disclosed in the Unexamined Japanese Patent Publication No. 2010-97974, 2DEG layer 107 in second channel layer 105 cannot escape from second channel layer 105 to a left direction in the drawing and is confined in the thin channel layer. Thus, controllability by the gate voltage is improved, and the normally-OFF operation can be more readily implemented. Furthermore, since the above pn junction is sandwiched between gate electrode 110 and 2DEG layer 107, a gate leak current can be considerably reduced. Furthermore, the channel is controlled by p-type gate layer 103 from the lateral direction, the gate length can be substantially determined by the thickness of p-type gate layer 103. Thus, the gate length can be readily shortened, and the high-speed operation can be performed.

First Variation of Second Exemplary Embodiment

Figure 7:
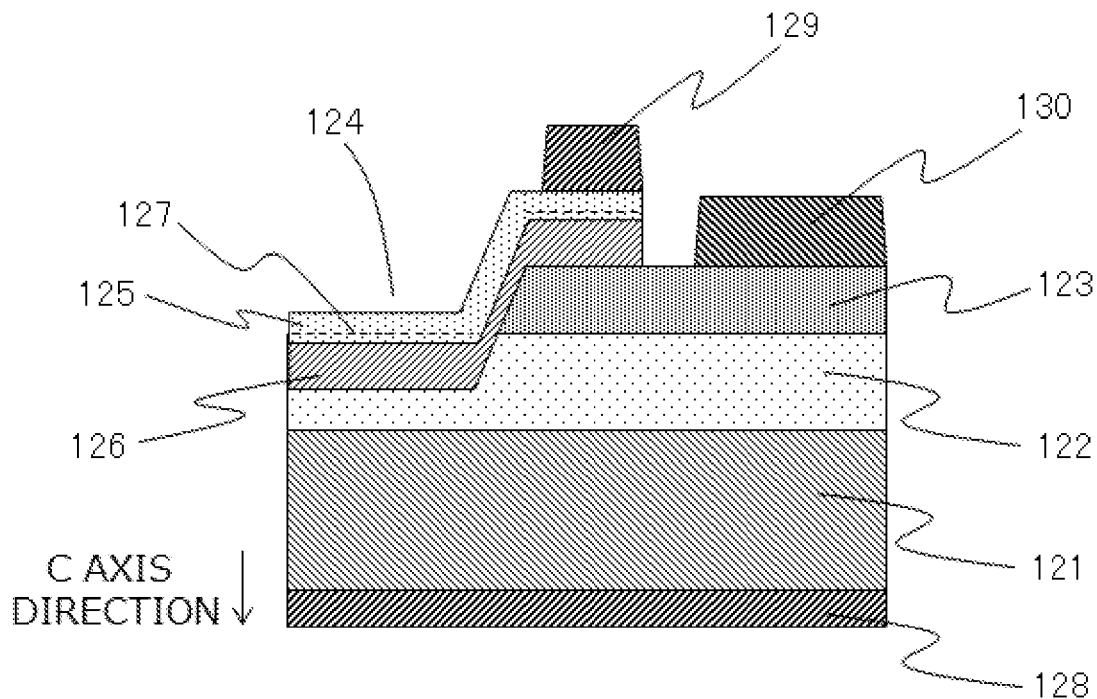
FIG. 7 is a view illustrating a cross-sectional structure of a semiconductor device in a first variation of the second exemplary embodiment.

FIG. 7 shows a cross-sectional structure of a semiconductor device in the first variation of the second exemplary embodiment shown in FIG. 6. The semiconductor device in this variation is an FET serving as a vertical HEMT in which 2DEG layer 127 is depleted from a side direction, and carrier supply layer 126 is partially thick. In addition, a minimum configuration is shown in this structure and the structure is not limited to this. Furthermore, a group III nitride semiconductor is used in describing this exemplary embodiment, but the present disclosure is not limited to this.

This structure differs from the structure shown in FIG. 6 in that a thickness of carrier supply layer 106 is not uniform. More specifically shown in FIG. 7, both a part of carrier supply layer 126 formed along a bottom portion of recess 124 and a part of carrier supply layer 126 formed along an upper surface of p-type gate layer 123 are thicker than a part of carrier supply layer 126 formed along a side portion of recess 124.

In this structure, a concentration in 2DEG layer 127 along the side portion of recess 124 is varied by adjusting a thickness and an Al composition of carrier supply layer 126 (in a case where carrier supply layer 126 is made of AlGaN) so that an appropriate Vth can be obtained. For example, in this structure, in order to implement the normally-OFF operation, the thickness and the Al composition of carrier supply layer 126 (in the case where carrier supply layer 126 is made of AlGaN) are adjusted so that the concentration of 2DEG layer 127 along the side portion of recess 124 is substantially eliminated when the gate voltage is at 0 V. In other words, by locally thickening carrier supply layer 126 formed along the bottom portion of recess 124, and carrier supply layer 126 formed along the upper surface of p-type gate layer 123 in comparison with carrier supply layer 126 formed along the side portion of recess 124, the concentration of 2DEG layer 127 in channel layer 125 that is in contact with carrier supply layer 126 formed along the bottom portion of recess 44, and in channel layer 125 that is in contact with carrier supply layer 126 formed along the upper surface of p-type gate layer 123 can be locally increased in comparison with the concentration of 2DEG layer 127 in channel layer 125 that is in contact with carrier supply layer 126 formed along the side portion of recess 124. As a result, resistance between the source and the drain can be reduced, and ON-resistance of the device can be reduced. That is, by locally increasing or reducing the thickness of carrier supply layer 126, the 2DEG concentration in 2DEG layer 127 can be locally increased or reduced. Consequently, it becomes possible to manufacture a device having both characteristics of the normally-OFF operation and low ON-resistance.

In this structure, after recess 124 has been formed, second channel layer 125 and carrier supply layer 126 are formed in a regrowth process by an appropriate crystal growth technique such as MOCVD method or MBE method. When the regrowth process is performed in recess 124 having a steep tapered angle at the side portion (that is an angle of the side portion of recess 124 with respect to a bottom surface of substrate 121 (provided in a lateral direction in the drawing)), the thickness of carrier supply layer 126 can be locally increased or reduced in a self-aligned process by differentiating a growth rate between a direction perpendicular to the bottom surface of substrate 121 (vertical direction), and a horizontal direction (lateral direction) in a regrowth condition. When a group III nitride semiconductor containing Al such as AlGaN is grown, the growth rate in the lateral direction is much lower than that in the vertical direction in general. Therefore, when carrier supply layer 126 is made of AlGaN (or group III nitride semiconductor containing Al), and the tapered angle is formed to some extent at the side portion of recess 124, the thickness of carrier supply layer 126 along the side portion of recess 124 can be small in the self-aligned process, so that it becomes possible to provide a device having both characteristics of the normally-OFF operation and the low ON-resistance in the one regrowth process. More specifically, when the tapered angle is smaller than 20 degrees, the thicknesses of carrier supply layer 126 (made of AlGaN, for example) are substantially the same in the side portion and the bottom portion of recess 124. Meanwhile, when the tapered angle is greater than 85 degrees, the thickness of carrier supply layer 126 (made of AlGaN, for example) hardly grows at the side portion of recess 124, and piezoelectric charges to bring electrons together in a lower portion of carrier supply layer 126 are not generated, so that there is almost no concentration in 2DEG layer 127 along the side portion of recess 124. Thus, in order to locally increase or reduce the thickness of carrier supply layer 126 in the self-aligned process, the tapered angle at the side portion of recess 124 is preferably between 20 degrees and 85 degrees, and more preferably between 40 degrees and 80 degrees.

Second Variation of Second Exemplary Embodiment

Figure 8:
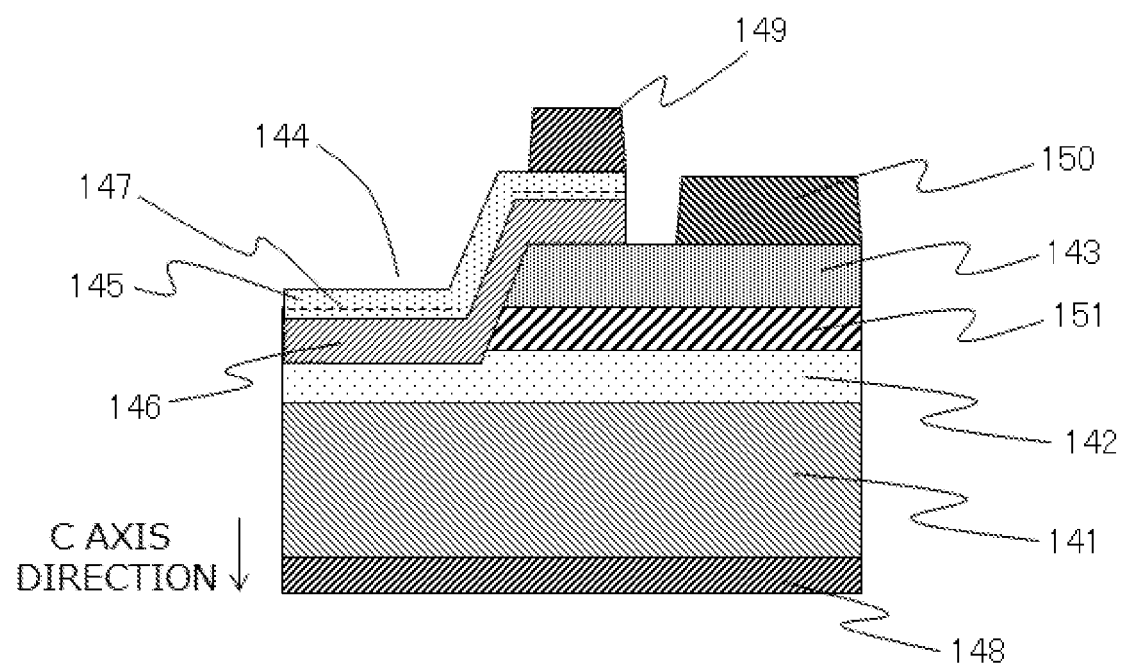
FIG. 8 is a view illustrating a cross-sectional structure of a semiconductor device in a second variation of the second exemplary embodiment.

FIG. 8 shows a cross-sectional structure of a semiconductor device in the second variation of the second exemplary embodiment shown in FIG. 6. The semiconductor device in this variation is an FET serving as an inverted-type vertical HEMT in which a SL (super lattice) layer is formed, and a 2DEG layer is depleted from a side direction. In addition, a minimum configuration is shown in this structure and the structure is not limited to this. Furthermore, a group III nitride semiconductor is used in describing this exemplary embodiment, but the present disclosure is not limited to this.

This structure provides normal SL layer 151 made of AlGaN/GaN or AlGaN/AlN between first channel layer 142 and p-type gate layer 143, in comparison with the structure shown in FIG. 6.

Thus, a vertical withstand voltage between ohmic-contacting electrode 148 and gate electrode 150 is improved, so that a gate leak current can be reduced.

In addition, SL layer 151 is not necessarily the SL layer in particular, and it may be a high-resistance AlGaN layer, that is, it may be composed of a single layer or multiple layers made of material such as AlN, InN, GaN, AlGaN, InGaN, and AlInGaN which can improve the vertical withstand voltage between ohmic-contacting electrode 148 and gate electrode 150.

According to the nitride semiconductor device in the present disclosure, the normally-OFF operation can be readily implemented, so that the device can be low in power consumption.

What is claimed is:
1. A semiconductor device comprising:
   a substrate;
   a first nitride semiconductor layer formed on the substrate;
   a p-type nitride semiconductor layer formed on the first nitride semiconductor layer;
   a recess having a bottom portion which reaches the first nitride semiconductor layer through a part of the p-type nitride semiconductor layer;

a third nitride semiconductor layer formed to cover the bottom portion of the recess, a side portion of the recess, and a part of an upper surface of the p-type nitride semiconductor layer;

a fourth nitride semiconductor layer formed on an upper surface of the third nitride semiconductor layer;

a first electrode formed on a rear surface of the substrate;

a gate electrode formed on the upper surface of the p-type nitride semiconductor layer; and a second electrode that is in contact with the third nitride semiconductor layer or the fourth nitride semiconductor layer, wherein the third nitride semiconductor layer has a bandgap different from a bandgap of the fourth nitride semiconductor layer.

2. The semiconductor device according to claim 1, wherein the fourth nitride semiconductor layer has the bandgap greater than the bandgap of the third nitride semiconductor layer.

3. The semiconductor device according to claim 2, wherein a thickness of the fourth nitride semiconductor layer is greater in a portion of the fourth nitride semiconductor layer formed along the bottom portion of the recess and the upper surface of the p-type nitride semiconductor layer than in a portion of the fourth nitride semiconductor layer formed along the side portion of the recess.

4. The semiconductor device according to claim 2, wherein a thickness of the third nitride semiconductor layer is greater in a portion of the third nitride semiconductor layer formed along the bottom portion of the recess and the upper surface of the p-type nitride semiconductor layer than in a portion of the third nitride semiconductor layer formed along the side portion of the recess.

5. The semiconductor device according to claim 2, wherein the side portion of the recess has a tapered angle that falls within a range from 40 degrees to 80 degrees both inclusive.

6. The semiconductor device according to claim 2, further comprising a fifth nitride semiconductor layer between the first nitride semiconductor layer and the p-type nitride semiconductor layer, wherein a bottom portion of the fifth nitride semiconductor layer is located above the bottom portion of the recess.

7. The semiconductor device according to claim 1, wherein the third nitride semiconductor layer has the bandgap greater than the bandgap of the fourth nitride semiconductor layer.

8. The semiconductor device according to claim 7, wherein a thickness of the third nitride semiconductor layer is greater in a portion of the third nitride semiconductor layer formed along the bottom portion of the recess and the upper surface of the p-type nitride semiconductor layer than in a portion of the third nitride semiconductor layer formed along the side portion of the recess.

9. The semiconductor device according to claim 7, wherein the side portion of the recess has a tapered angle that is between 40 degrees and 80 degrees both inclusive.

10. The semiconductor device according to claim 7, further comprising a fifth nitride semiconductor layer between the first nitride semiconductor layer and the p-type nitride semiconductor layer, wherein a bottom portion of the fifth nitride semiconductor layer is located above the bottom portion of the recess.

* * * * *